US011003036B2

(12) United States Patent
Lin et al.

(10) Patent No.: US 11,003,036 B2
(45) Date of Patent: May 11, 2021

(54) PIXEL ARRAY SUBSTRATE

(71) Applicant: Au Optronics Corporation, Hsinchu (TW)

(72) Inventors: Ching-Shun Lin, Hsinchu (TW); Chao-Chien Chiu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/889,756

(22) Filed: Jun. 1, 2020

(65) Prior Publication Data

US 2020/0292900 A1    Sep. 17, 2020

Related U.S. Application Data

(63) Continuation of application No. 16/194,394, filed on Nov. 19, 2018, now Pat. No. 10,718,985.

(30) Foreign Application Priority Data

Dec. 8, 2017    (TW) .................................. 106143060

(51) Int. Cl.
  *G02F 1/1362*    (2006.01)
  *G02F 1/1368*    (2006.01)
  *H01L 29/66*    (2006.01)
  *H01L 27/12*    (2006.01)
  *H01L 29/786*    (2006.01)

(52) U.S. Cl.
  CPC ...... *G02F 1/136286* (2013.01); *G02F 1/1368* (2013.01); *G02F 1/136227* (2013.01); *H01L 27/1225* (2013.01); *H01L 27/1244* (2013.01); *H01L 27/1248* (2013.01); *H01L 29/66742* (2013.01); *H01L 29/78693* (2013.01)

(58) Field of Classification Search
  CPC .................................................. G02F 1/136286
  See application file for complete search history.

(56) References Cited

U.S. PATENT DOCUMENTS

| 2014/0340607 | A1* | 11/2014 | Nakata | H01L 29/78693 |
| | | | | 349/46 |
| 2017/0052417 | A1* | 2/2017 | Noh | G02F 1/1343 |
| 2019/0227671 | A1* | 7/2019 | Hu | G06F 3/044 |

* cited by examiner

*Primary Examiner* — Sang V Nguyen
(74) *Attorney, Agent, or Firm* — JCIPRNET

(57) ABSTRACT

A pixel array substrate including pixel units is provided. Each of the pixel units includes a thin film transistor, a first insulating layer disposed on the thin film transistor, a common electrode disposed on the first insulating layer, a second insulating layer covering the common electrode, and a pixel electrode disposed on the second insulating layer. The first insulating layer includes a first via. The common electrode includes an opening and connects to the first via. The second insulating layer includes a second via and connects to the opening and the first via. The pixel electrode connects to the thin film transistor through the second via, the opening and the first via. The first via has two first sides opposite to each other and the opening has two third sides opposite to each other are aligned. A fourth side of the opening is not connected to the first via and the second via.

20 Claims, 8 Drawing Sheets

PIXEL ARRAY SUBSTRATE

CROSS-REFERENCE TO RELATED APPLICATION

This application is a continuation application of and claims the priority benefit of U.S. application Ser. No. 16/194,394, filed on Nov. 19, 2018, now allowed, which claims the priority benefit of Taiwan application Ser. No. 106143060, filed on Dec. 8, 2017. The entirety of each of the above-mentioned patent applications is hereby incorporated by reference herein and made a part of this specification.

BACKGROUND

Technical Field

The invention relates to a substrate and more particularly, to a pixel array substrate.

Description of Related Art

Along with the progress of technologies, resolution specifications of display panels are continuously increased. Taking a fringe-field switching (FFS) mode display panel as an example, a pixel array substrate thereof includes thin film transistors, pixel electrodes electrically connected with the thin film transistors and common electrodes overlapping the pixel electrodes. Generally, a first insulating layer covers the thin film transistors, the common electrodes are disposed on the first insulating layer, a second insulating layer covers the common electrode, and the pixel electrodes are disposed on the second insulating layer. The pixel electrodes at least have to pass through openings of the common electrodes and openings of the second insulating layer, so as to be electrically connected with the thin film transistors. In order to prevent the pixel electrodes, when passing through the common electrodes, form having a short circuit with the common electrodes, all sides of the opening of each common electrode are kept apart from all sides of the opening of the second insulating layer by a certain distance. However, the aforementioned distance occupies an area actually employed for displaying, which results in difficulty in further improvement of the resolution.

SUMMARY

The invention provides a pixel array substrate, and a display panel including the pixel array substrate has high resolution.

A pixel array substrate of the invention includes a plurality of pixel units. Each of the pixel units includes a thin film transistor, a first insulating layer disposed on the thin film transistor, a common electrode disposed on the first insulating layer, a second insulating layer covering the common electrode and a pixel electrode disposed on the second insulating layer. The first insulating layer has a first via, wherein the first via has two first sides opposite to each other in a first direction and two second sides opposite to each other in a second direction. The common electrode has an opening communicated with the first via, wherein the opening has two third sides opposite to each other in the first direction and at least one fourth side in the second direction, the third sides of the opening of the common electrode are aligned with the first sides of the first via of the first insulating layer, and a width of the opening of the common electrode in the first direction is substantially equal to a width of the first via of the first insulating layer in the first direction. The second insulating layer has a second via communicated with the opening and the first via, wherein the fourth side of the opening of the common electrode is not adjacent to the first via and the second via. The pixel electrode are electrically connected with the thin film transistor through the second via of the second insulating layer, the opening of the common electrode and the first via of the first insulating layer. The pixel electrode has a connection portion and a main portion, the connection portion is overlapped with the first via of the first insulating layer, the main portion is disposed outside the first via of the first insulating layer, the connection portion and the main portion are arranged in the second direction, and the first direction is perpendicular to the second direction.

A pixel array substrate of the invention includes a plurality of pixel units, a touch signal line, a connection electrode and a bridge electrode. Each of the pixel units includes a thin film transistor, a first insulating layer disposed on the thin film transistor, a common electrode disposed on the first insulating layer, a second insulating layer covering the common electrode, a pixel electrode disposed on the second insulating layer and electrically connected with the thin film transistor, a scan line and a data line electrically connected with the thin film transistor and staggered with each other. The scan line extends along a first direction, and the data line extends along a second direction. The touch signal line is disposed between the data lines of two adjacent pixel units and extending along the second direction. The connection electrode is located above the touch signal line and electrically connected between two of the common electrodes of two adjacent pixel units. The bridge electrode is electrically connected between the touch signal line and the connection electrode, wherein the bridge electrode is located between two of the pixel electrodes of two adjacent pixel units and separated from the pixel electrodes.

Based on the above, when the insulating layers are patterned, the sides of the opening of the common electrode can be self-aligned with the sides of the vias by using a patterned common electrode employed as a hard mask of the first insulating layer, such that the sides of the opening of the common electrode can be sufficiently adjacent to the sides of the vias of the first insulating layer to increase an area of the physical portion of the common electrode, thereby increasing an aperture ratio of the pixel array substrate. In addition, as the width of the connection portion of the pixel electrode in the first direction is smaller than the width of the first via in the first direction, the connection portion becomes a fine branch of the pixel electrode which is filled into the first via and the second via. In this way, when a film which the pixel electrode belongs to and a film which the common electrode belongs to are not aligned to each other in high accuracy, the connection portion of the pixel electrode can be prevented from contacting the side walls of the common electrode, thereby avoiding a short-circuit issue. In this way, a manufacturing yield of the pixel array substrate can be enhanced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
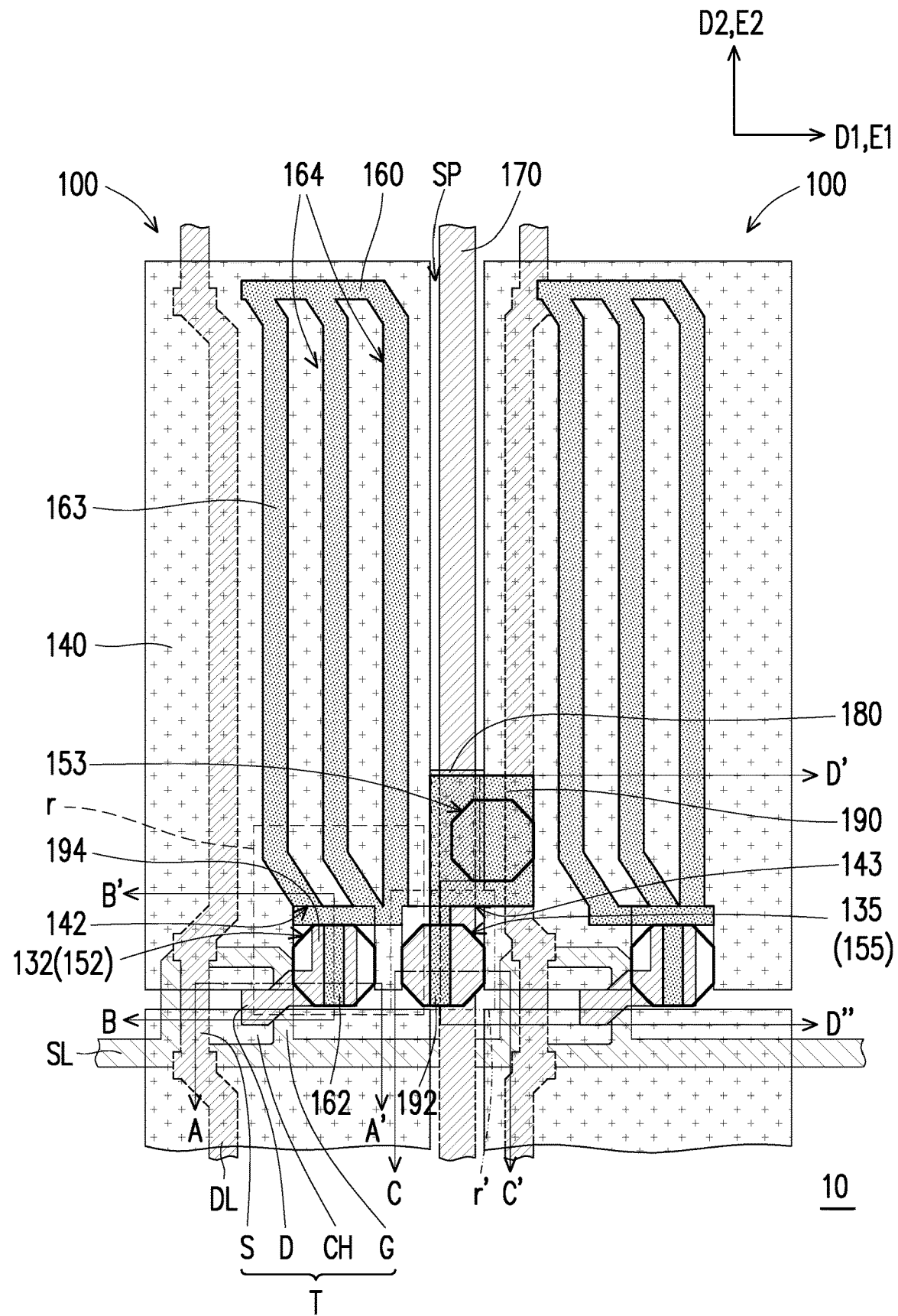
FIG. 1 is a schematic top view illustrating a pixel array substrate according to an embodiment of the invention.
Figure 2A:
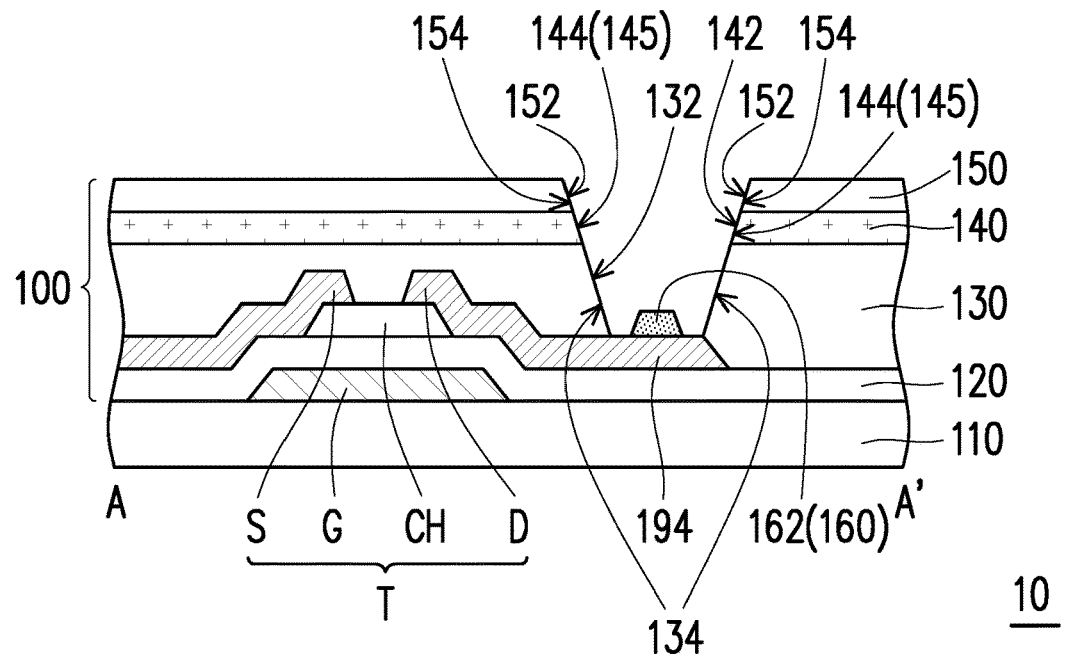
FIG. 2A is a schematic cross-sectional view corresponding to the section line A-A' depicted in FIG. 1.
Figure 2B:
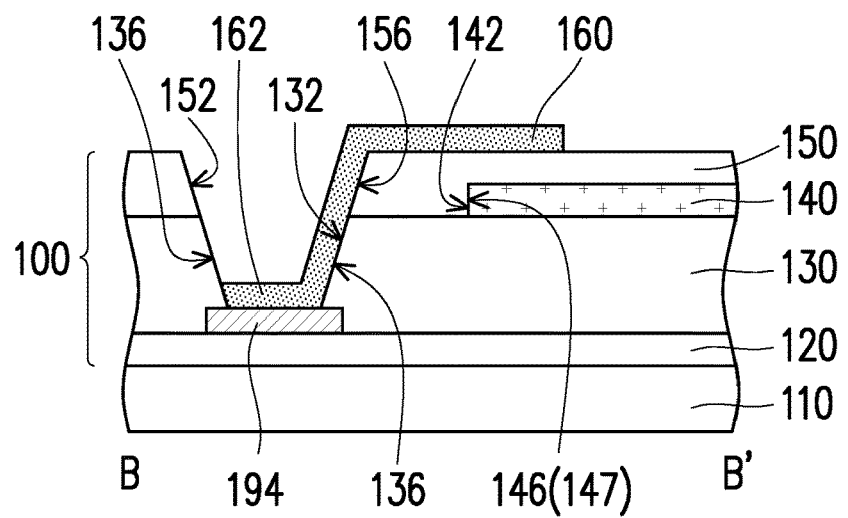
FIG. 2B is a schematic cross-sectional view corresponding to the section line B-B' depicted in FIG. 1.

FIG. 1 is a schematic top view illustrating a pixel array substrate 10 according to an embodiment of the invention. FIG. 2A is a schematic cross-sectional view of the pixel array substrate 10 corresponding to the section line A-A' depicted in FIG. 1. FIG. 2B is a schematic cross-sectional view of the pixel array substrate 10 corresponding to the section line B-B' depicted in FIG. 1.

Referring to FIG. 1 and FIG. 2A, the pixel array substrate 10 includes a plurality of pixel units 100. The pixel units 100 are disposed on the base 110. The base 110 is mainly employed to carry components of the pixel array substrate 10. In the present embodiment, a material of the base 110 may include glass, quartz, an organic polymer, a non-transparent/reflective material (e.g., a wafer, ceramic, or the like) or other suitable materials. FIG. 1 only schematically illustrates two pixel units 100 of the pixel array substrate 10, but the number of the pixel units 100 included in the pixel array substrate 10 is not limited to two, and the number of the pixel units 100 of the pixel array substrate 10 may be determined based on an actual demand (e.g., a resolution requirement). A person with ordinary skill of the art may embody the pixel array substrate 10 as desired according to the two pixel units 100 illustrated in FIG. 1 and the description set forth below.

Referring to FIG. 1 and FIG. 2A, each of the pixel units 100 includes a thin film transistor (TFT) T, a first insulating layer 130, a common electrode 140, a second insulating layer 150 and a pixel electrode 160. In the present embodiment, each of the pixel units 100 further includes a scan line SL and a data line DL corresponding to each other. The scan line SL and the data line DL are disposed on the base 110. The scan line SL and the data line DL are staggered with each other. The scan line SL substantially extends along a first direction E1, the data line DL substantially extends along a second direction E2, and the first direction E1 is staggered with the second direction E2. For instance, in the present embodiment, the first direction E1 may be perpendicular to the second direction E2, but the invention is not limited thereto. Based on the consideration of conductivity, the scan line SL and the data line DL are generally made of a metal material, but the invention is not limited thereto, in other embodiments, the scan line SL and the data line DL may also be made of other conductive material, for example, an alloy, metal nitride, metal oxide, metal oxynitride or a stack layer consisting of a metal material and other conductive materials.

The thin film transistor T is electrically connected with the scan line SL and the data line DL. Specifically, in the present embodiment, the thin film transistor T includes a gate G, a semiconductor layer CH and a source S and a drain D which are respectively electrically connected with two different regions of the semiconductor layer CH. A gate insulating layer 120 is disposed between the gate G and the semiconductor layer CH. The scan line SL is electrically connected with the gate G of the thin film transistor T. For instance, in the present embodiment, the gate G may be a bump extending from the scan line SL, but the invention is not limited thereto. The data line DL is electrically connected with the source S of the thin film transistor T. For instance, in the present embodiment, the source S may be a part of an overlapping portion of the data line DL and the semiconductor layer CH, but the invention is not limited thereto.

Referring to FIG. 2A, in the present embodiment, the gate G may be located under the semiconductor layer CH, and the thin film transistor T may be a bottom gate transistor. However, the invention is not limited thereto, according to other embodiments, the thin film transistor T may be a top gate transistor or any other adaptive transistor. Further, in the present embodiment, the gate G and the scan line SL may together belong to a first conductive layer, while the data line DL, the source S and the drain D may together belong to a second conductive layer. However, the invention is not limited thereto, in other embodiments, the films which the gate G, the scan line SL, the data line DL, the source S and the drain D respectively belong to may be changed based on actual demands.

Referring to FIG. 1, FIG. 2A and FIG. 2B, the pixel electrode 160 is electrically connected with the thin film transistor T. Specifically, the pixel electrode 160 is electrically connected with the drain D of the thin film transistor T. For instance, in the present embodiment, each of the pixel units 100 further includes a conductive pattern 194 electrically connected with the drain D, the pixel electrode 160 has a connection portion 162, and the connection portion 162 of the pixel electrode 160 may directly cover the conductive pattern 194, so as to be electrically connected with the drain D of the thin film transistor T through the conductive pattern 194. The pixel electrode 160 has the connection portion 162 and a main portion 163. The connection portion 162 is overlapped with the first via 132 of the first insulating layer 130. The main portion 163 is disposed outside the first via 132 of the first insulating layer 130. The connection portion 162 and the main portion 163 are arranged in the second direction D2, and the first direction D1 is perpendicular to the second direction D2. In the present embodiment, the conductive pattern 194 and the drain D of the thin film transistor T may together belong to the second conductive layer, but the invention is not limited thereto, and in other embodiments, the pixel electrode 160 may also be electrically connected with the thin film transistor T through other components. In the present embodiment, the first direction D1 and the first direction E1 may be the same, the second direction D2 and the second direction E2 may be the same, but the invention is not limited thereto. In other embodiments, the first direction D1 and the first direction E1 may be different, and the second direction D2 and the second direction E2 may be different.

In the present embodiment, the pixel electrode 160 may be a transparent conductive layer including metal oxide, such as indium tin oxide (ITO), indium zinc oxide (IZO), aluminum tin oxide (ATO), aluminum zinc oxide (AZO), indium germanium zinc oxide, other suitable oxide or a stack layer consisting of at least two of the above materials, but the invention is not limited thereto. The invention is not intent to limit that the pixel electrode 160 has to be completely transparent, and in other embodiments, the pixel electrode 160 may also be a reflective conductive layer or a combination of a reflective conductive layer and a transparent conductive layer if the pixel array substrate 10 is applied in a reflective or a transflecive display panel.

Referring to FIG. 1, the common electrode 140 overlaps the pixel electrode 160. In the present embodiment, the common electrode 140 and the pixel electrode 160 are disposed on the same base 110. The pixel electrode 160 has a plurality of slits 164, an electric field between edges of the slits 164 and the common electrode 140 is employed to drive a display medium (e.g., liquid crystal). In other words, in the present embodiment, a display panel (not shown) including the pixel array substrate 10 is, for example, a fringe-field switching (FFS) mode display panel.

In the present embodiment, each of the pixel units 100 may include the common electrode 140 overlapping the pixel electrode 160 thereof. In a display mode, the common electrodes 140 of the plurality of pixel units 100 have the same common voltage. In the present embodiment, a spacing SP (which is illustrated in FIG. 1) is between the common electrodes 140 of the adjacent pixel units 100, the pixel array substrate 10 further includes a connection electrode 180 (which is illustrated in FIG. 1 and FIG. 5B), the connection electrode 180 is disposed in the spacing SP to electrically connect between the common electrodes 140 of the adjacent pixel units 100. In the present embodiment, the connection electrode 180 and the common electrode 140 may belong to the same film, but the invention is not limited thereto. In other embodiments, there may be no spacing between the common electrodes 140 of the adjacent pixel units 100.

Figure 3:
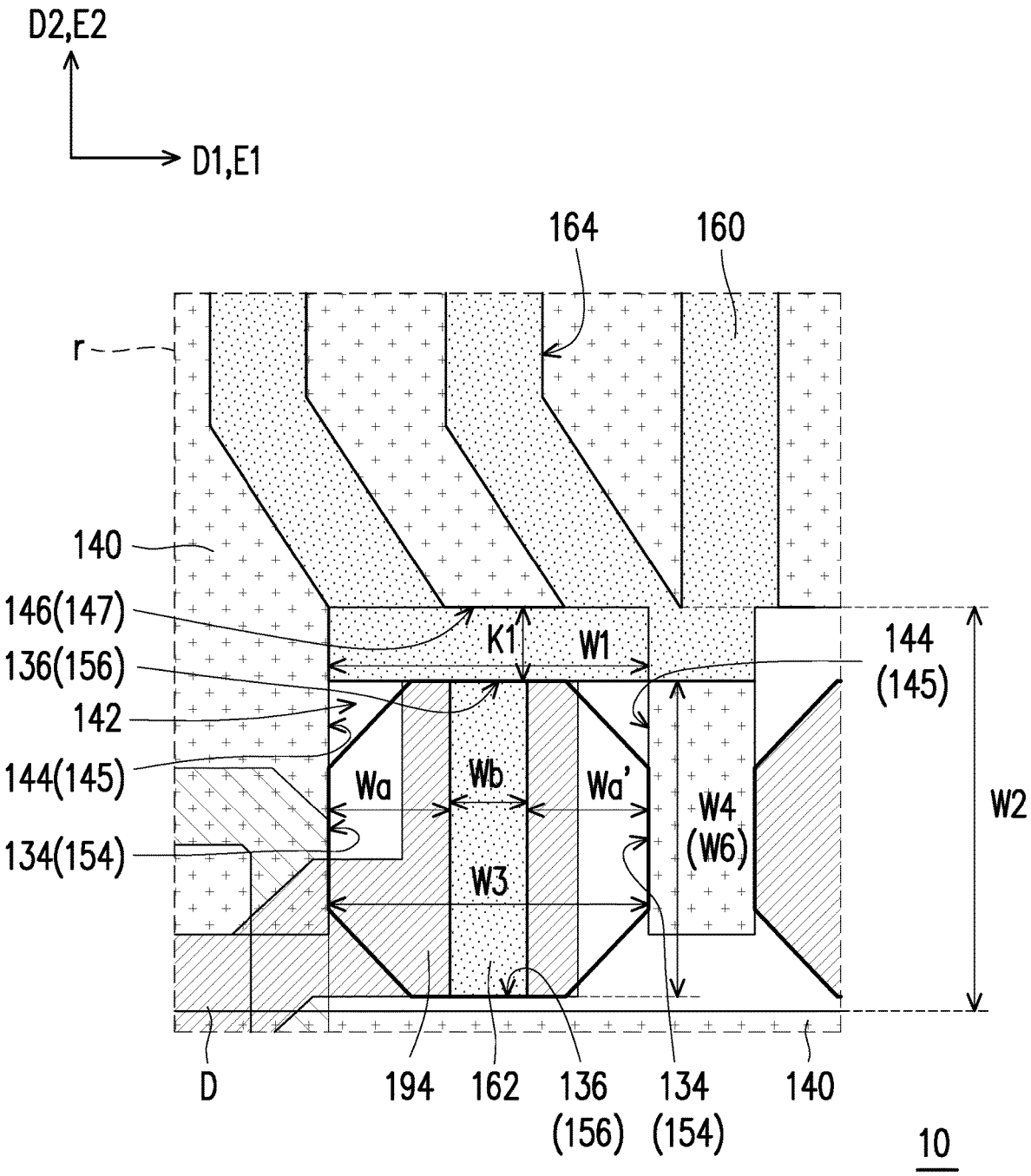
FIG. 3 is a schematic enlarged view of the portion r depicted in FIG. 1.

FIG. 3 is a schematic enlarged view of the portion r depicted in FIG. 1. Referring to FIG. 1, FIG. 2A, FIG. 2B and FIG. 3, the first insulating layer 130 (which is illustrated in FIG. 2A) is disposed on the thin film transistor T to cover the thin film transistor T. The first insulating layer 130 has a first via 132, and the first via 132 has two first sides 134 (which are illustrated in FIG. 2A and FIG. 3) opposite to each other in the first direction D1 and two second sides 136 (which are illustrated in FIG. 2B and FIG. 3) opposite to each other in the second direction D2. In the present embodiment, a top view-shape of the first via 132 is, for example, an octagonal shape. However, the invention is not limited thereto, according to other embodiments, the top view-shape of the first via 132 may also be a rectangular shape, another polygonal shape, a circular shape or other adaptive shapes. In the present embodiment, a material of the first insulating layer 130 includes an inorganic material (e.g., silicon oxide, silicon nitride, silicon oxynitride, other suitable materials or a stack layer consisting of at least two of the above materials), an organic material, other suitable materials or a combination of the above materials.

Referring to FIG. 1, FIG. 2A and FIG. 2B, in the present embodiment, the common electrode 140 is disposed on the first insulating layer 130 and has an opening 142. A part of the opening 142 of the common electrode 140 is communicated with the first via 132. Referring to FIG. 1, FIG. 2A, FIG. 2B and FIG. 3, the opening 142 of the common electrode 140 has two third sides 144 (which are illustrated in FIG. 2A and FIG. 3) opposite to each other in the first direction D1 and at least one fourth side 146 (which is illustrated in FIG. 2B and FIG. 3) in the second direction D2. The common electrode 140 has two opposite first side walls 145 (which are illustrated in FIG. 2A) and at least one second side wall 147 (which is illustrated in FIG. 2B). In other words, the first side walls 145 of the common electrode 140 define the third sides 144 of the opening 142, and the second side wall 147 defines the fourth side 146 of the opening 142.

Referring to FIG. 1, FIG. 2A and FIG. 3, in the present embodiment, the third sides 144 of the opening 142 of the common electrode 140 are aligned with the first sides 134 of the first via 132 of the first insulating layer 130. In other words, a width W1 the opening 142 of the common electrode 140 in the first direction D1 is substantially equal to a width W3 of the first via 132 of the first insulating layer 130 in the first direction D1. In addition, as illustrated in FIG. 2A, the opening 142 of the common electrode 140 and the first via 132 of the first insulating layer 130 which is connected thereto expose the conductive pattern 194 electrically connected with the drain D.

Referring to FIG. 1, FIG. 2B and FIG. 3, in the present embodiment, a width W2 of the opening 142 of the common electrode 140 in the second direction D2 may be selectively greater than or equal to a width W4 of the first via 132 of the first insulating layer 130 in the second direction D2. As illustrated in FIG. 2B and FIG. 3, the fourth side 146 of the opening 142 of the common electrode 140 in the second direction D2 is not aligned with the second sides 136 of the first via 132 in the second direction D2, and the fourth side 146 of the opening 142 of the common electrode 140 is apart from the second sides 136 of the first via 132 of the first insulating layer 130 by a distance K1. As illustrated in FIG. 2B, a part of the second insulating layer 150 covers the second side wall 147 of the common electrode 140 and is located between the fourth side 146 of the common electrode 140 and the second sides 136 of the first insulating layer 130. A part of the pixel electrode 160 crosses the part of the second insulating layer 150 to contact the conductive pattern 194, so as to be electrically connected with the drain D of the thin film transistor T. In this way, the pixel electrode 160 is capable of being electrically connected with the drain D, without having a short circuit with the common electrode 140.

Referring to FIG. 1, FIG. 2A, FIG. 2B and FIG. 3, in the present embodiment, in each of the pixel units 100, the second insulating layer 150 covers the common electrode 140 and has a second via 152. The second via 152 of the second insulating layer 150 is communicated with a part of the opening 142 of the common electrode 140 and the first via 132 of the first insulating layer 130. The fourth side 146 of the opening 142 of the common electrode 140 is not adjacent to the first via 132 of the first insulating layer 130 and the second via 152 of the second insulating layer 150. The second insulating layer 150 covers the second side wall 147 of the common electrode 140, without covering the first side walls 145 of the common electrode 140.

In a manufacturing process of the pixel array substrate 10 of the present embodiment, after the thin film transistor T is completed, the entire first insulating layer 130, the common electrode 140 having the opening 142 and the entire second insulating layer 150 are sequentially formed. Then, the first insulating layer 130 and the second insulating layer 150 may be patterned with the same photo mask to form the second via 152 of the second insulating layer 150 and the first via 132 of the first insulating layer 130. Before the first insulating layer 130 and the second insulating layer 150 are patterned, the common electrode 140 having the opening 142 is disposed on the first insulating layer 130, and thus, during the process of patterning the first insulating layer 130 and the second insulating layer 150, the common electrode 140 protects the first insulating layer 130 thereunder. The common electrode 140 may be considered as a hard mask of the first insulating layer 130, and the third sides 144 of the opening 142 of the common electrode 140 is self-aligned with the first sides 134 of the first via 132 of the first insulating layer 130. In this way, the third sides 144 of the opening 142 of the common electrode 140 are capable of being sufficiently adjacent to the first sides 134 of the first via 132 of the first insulating layer 130 (i.e., the third sides 144 of the opening 142 of the common electrode 140 are aligned with the first sides 134 of the first via 132 of the first insulating layer 130) to increase an area for disposing a physical portion of the common electrode 140, so as to enhance an aperture ratio of the pixel array substrate 10. Referring to FIG. 2A and FIG. 3, to be specific, the second via 152 of the second insulating layer 150 has two fifth sides 154 opposite to each other in the first direction D1.

Referring to FIG. 2B and FIG. 3, the second via 152 of the second insulating layer 150 has two sixth sides 156 opposite to each other in the second direction D2. The width W2 of the opening 142 of the common electrode 140 in the second direction D2 may be selectively greater than a width W6 of the second via 152 of the second insulating layer 150 in the second direction D2. In the present embodiment, the second sides 136 of the first via 132 may be aligned with and adjacent to the sixth sides 156 of the second via 152, and the fifth sides 154 of the second via 152 may be aligned with the first sides 134 of the first via 132. Furthermore, in the present embodiment, as the second via 152 of the second insulating layer 150 and the first via 134 of the first insulating layer 130 are formed with the same mask, and an area of the second via 152 does not overlap the physical portion of the common electrode 140, the sides of the second via 152 of the second insulating layer 150 may be substantially and completely aligned with the sides of the first via 134 of the first insulating layer 130. However, the invention is not limited thereto, in other embodiments, the sides of the second via 152 of the second insulating layer 150 may also be partially aligned or partially non-aligned with the sides of the first via 134 of the first insulating layer 130, which will be illustrated with reference to other drawings for description below for example.

Referring to FIG. 1, FIG. 2A, FIG. 2B and FIG. 3, in the present embodiment, the pixel electrode 160 is disposed on the second insulating layer 150 and electrically connected with the drain D of the thin film transistor T through the second via 152 of the second insulating layer 150, the opening 142 of the common electrode 140 and the first via 132 of the first insulating layer 130. To be specific, the pixel electrode 160 extends, along the second direction D2, onto the second insulating layer 150 covering the second side wall 147 of the common electrode 140, without covering the first side walls 145 of the common electrode 140. The connection portion 162 of the pixel electrode 160 extends into the second via 152 of the second insulating layer 150, the opening 142 of the common electrode 140 and the first via 132 of the first insulating layer 130 from a part of the pixel electrode 160 overlapping the common electrode 140 in a direction perpendicular to the substrate. The connection portion 162 may cross the sixth sides 156 of the second insulating layer 150 and the second sides 136 of the first insulating layer 130 in the second direction D2 to enter an area of the second via 152, a part of the opening 142 overlapping the second via 152 and the first via 132.

In the present embodiment, a width Wb of the connection portion 162 of the pixel electrode 160 in the first direction D1 is smaller than the width W1 of the opening 142 of the common electrode 140 in the first direction D1. By viewing in the direction perpendicular to the substrate, the connection portion 162 is separated from the two opposite third sides 144 of the opening 142 of the common electrode 140 in the first direction D1 respectively by distances Wa and Wa'. The connection portion 162 may be considered as a fine branch of the pixel electrode 160 which is filled into the second via 152 and the first via 132. The width Wb of the connection portion 162 in the first direction D1 is smaller than the width W1 of the opening 142 of the common electrode 140 in the first direction D1 (i.e., the width W1 is a distance between the two opposite first side walls 145 of the common electrode 140 in the first direction D0, and thus, even though a film which the pixel electrode 160 belongs to and a film which the common electrode 140 belongs to are not aligned to each other in high accuracy, the connection portion 162 of the thin pixel electrode 160 may be prevented from contacting the first side walls 145 of the common electrode 140, thereby avoiding a short-circuit issue. In this way, a manufacturing yield of the pixel array substrate 10 may be enhanced. For instance, in the present embodiment, the width Wb of the connection portion 162 may be, for example, 2.5 µm to 4 µm, and the width W1 of the opening 142 may be, for example, 10 µm to 12 µm, but the invention is not limited thereto.

Figure 4:
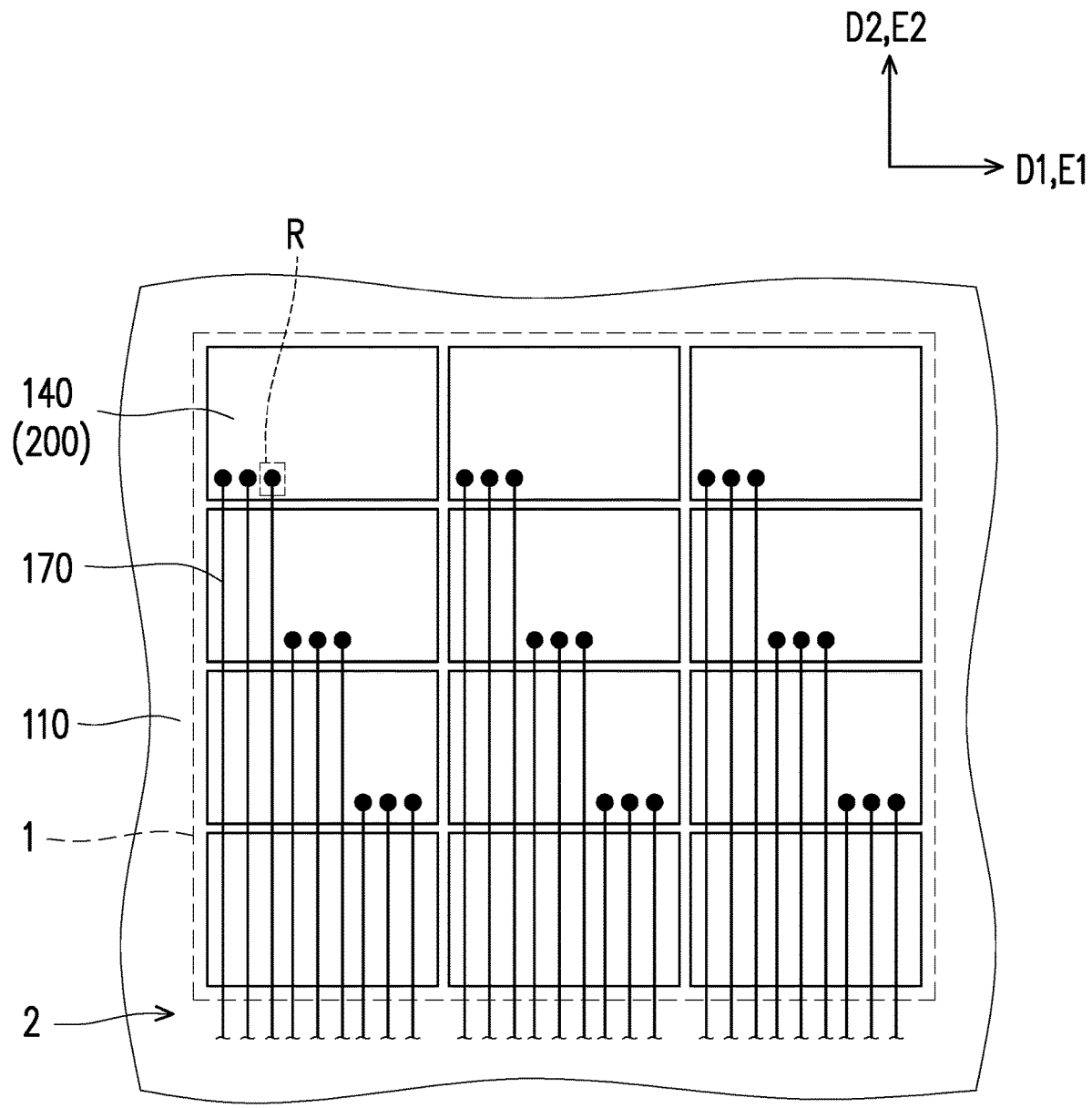
FIG. 4 is a schematic top view illustrating a pixel array substrate according to an embodiment of the invention.

FIG. 4 is a schematic top view illustrating a pixel array substrate according to an embodiment of the invention. FIG. 1 is the enlarged view of the region R depicted in FIG. 4. Referring to FIG. 1 and FIG. 4, in the present embodiment, a plurality of common electrodes 140 of the adjacent pixel units 100 may be electrically connected through the connection electrode 180 (which is illustrated in FIG. 1). In a touch control mode, a plurality of common electrodes 140 which are electrically connected with each other and concentrated in one block construct a group of common electrodes, and the common electrodes 140 of the same group may be considered as a touch sensing electrode 200 (which is illustrated in FIG. 4). In other words, the pixel array substrate 10 of the present embodiment is integrated with a touch control function, and the pixel array substrate 10, the display medium (not shown) and the opposite substrate (not shown) after being combined may form an in-cell touch display panel. In the present embodiment, the pixel array substrate 10 includes a plurality of touch sensing electrodes 200 and a plurality of touch signal lines 170 formed by a plurality of common electrodes 140. Each group of the common electrodes 140 (i.e., each touch sensing electrode 200) may be electrically connected with at least one corresponding touch signal line 170. The plurality of touch signal lines 170 extend out of a display region 1 (which is illustrated in FIG. 4) wherein the pixel electrodes 160 are located, so as to be electrically connected with a plurality pads (not shown) located in a peripheral region 2 (which is illustrated in FIG. 4).

Figure 5A:
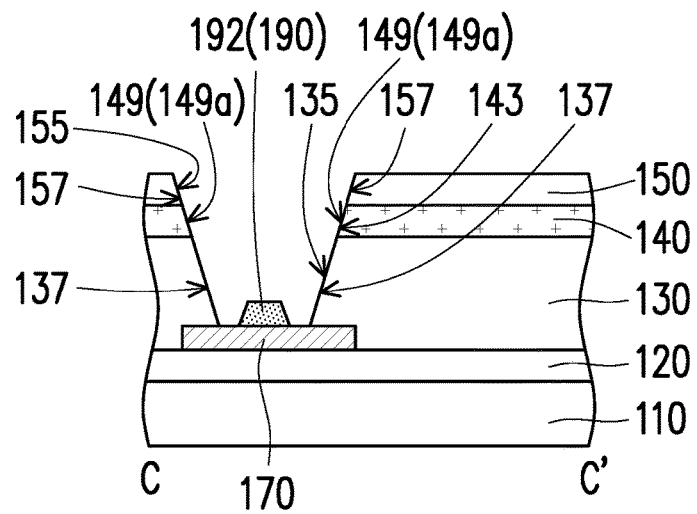
FIG. 5A is a schematic cross-sectional view corresponding to the section line C-C' depicted in FIG. 1.
Figure 5B:
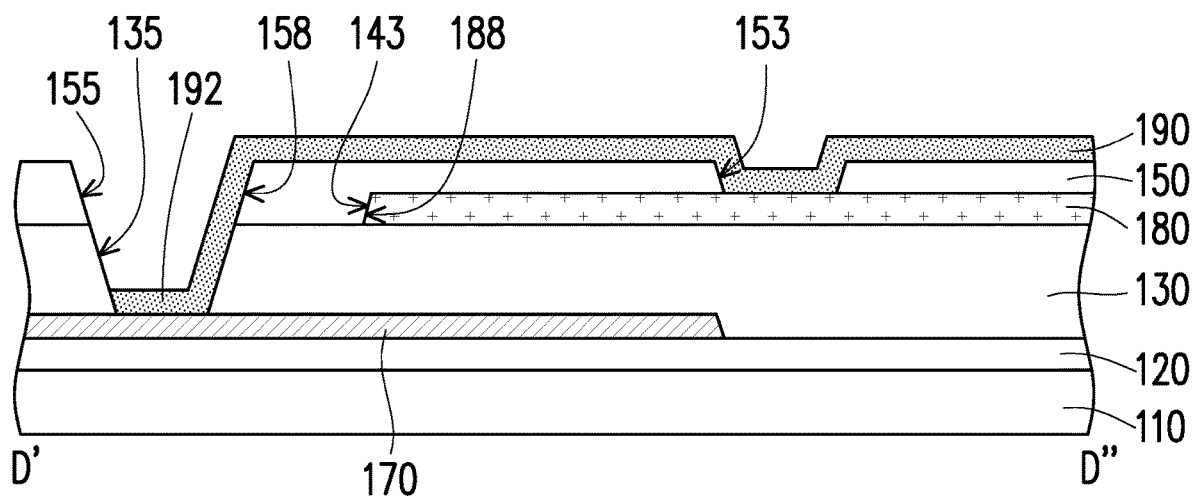
FIG. 5B is a schematic cross-sectional view corresponding to the section line D'-D" depicted in FIG. 1.
Figure 6:
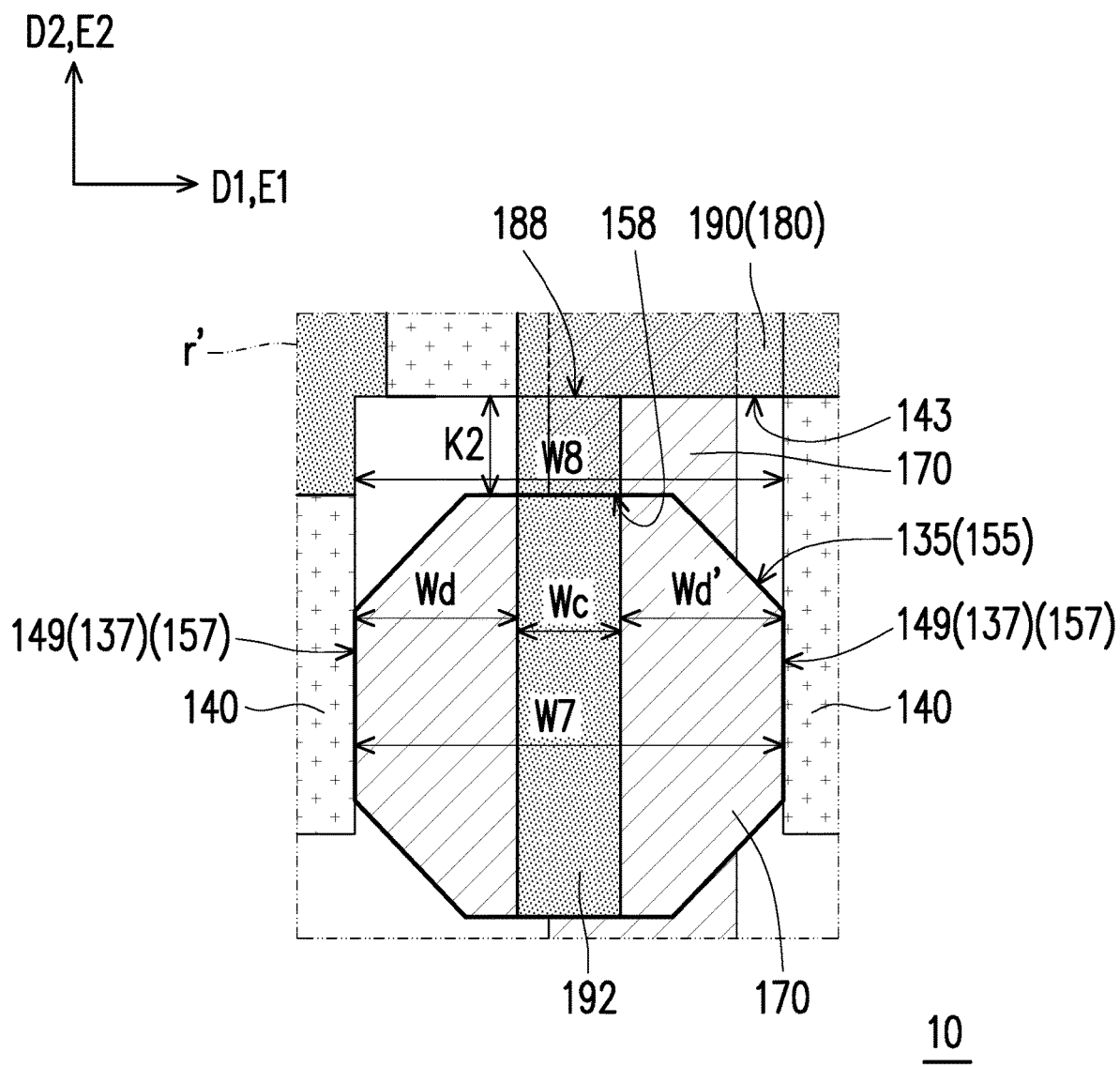
FIG. 6 is a schematic enlarged view of a part r' depicted in FIG. 1.

FIG. 5A is a schematic cross-sectional view of the pixel array substrate 10 corresponding to the section line C-C' depicted in FIG. 1. FIG. 5B is a schematic cross-sectional view of the pixel array substrate 10 corresponding to the section line D'-D" depicted in FIG. 1. FIG. 6 is a schematic enlarged view of a part r' depicted in FIG. 1. Referring to FIG. 1 and FIG. 5B, in the present embodiment, the second insulating layer 150 further has a third via 153 outside the second via 152, and the third via 153 is located between the pixel electrodes 160 of the adjacent pixel units 100. The third via 153 may be electrically connected with the connection electrode 180 between two adjacent common electrodes 140 and at least partially overlap the connection electrode. In the present embodiment, a top-view shape of the third via 153 may be an octagonal shape. However, the invention is not limited thereto, according to other embodiments, the top view-shape of the third via 153 may also be a rectangular shape, another polygonal shape, a circular shape or other adaptive shapes.

In the present embodiment, the pixel array substrate 10 further includes a bridge electrode 190, the bridge electrode 190 and the connection electrode 180 at least partially overlap with each other. The bridge electrode 190 is located between the pixel electrodes 160 of adjacent pixel units 100 and electrically separated from the pixel electrodes 160. In the present embodiment, the bridge electrode 190 and the pixel electrode 160 may belong to the same film, but the invention is not limited thereto. The bridge electrode 190 may be electrically connected with the connection electrode 180 between two adjacent common electrodes 140 through the third via 153 of the second insulating layer 150. In other words, an end of the bridge electrode 190 is electrically connected with the common electrode 140 employed as the touch sensing electrode 200, and the other end of the bridge electrode 190 (which is the connection portion 192) may be electrically connected with the touch signal line 170 through a fourth via 155 of the second insulating layer 150, a part of an opening 143 of the film which the common electrode 140 belongs to and a fifth via 135 of the first insulating layer 130.

Referring to FIG. 1 and FIG. 5A, the touch signal line 170 is disposed on the base 110, located between the data lines DL of two adjacent pixel units 100 and substantially extends along the second direction D2 or is disposed substantially in parallel to the data line DL. In the present embodiment, the touch signal line 170, the data line DL and the source S and the drain D of the thin film transistor T may together belong to the second conductive layer, but the invention is not limited thereto.

Referring to FIG. 1, FIG. 5A, FIG. 5B and FIG. 6, in the present embodiment, the second insulating layer 150 further has the fourth via 155 outside the second via 152 and outside the third via 153. The first insulating layer 130 further has the fifth via 135 communicated with the fourth via 155. In the present embodiment, top-view shapes of the fourth via 155 and the fifth via 135 may be octagonal. However, the invention is not limited thereto, according to other embodiments, the top-view shapes of the fourth via 155 and the fifth via 135 may also be a rectangular, other polygonal shaped, circular or other adaptive shapes. In the present embodiment, adjacent common electrodes 140 have two sides 149 opposite to each other in the first direction D1. The two opposite sides 149 and a tenth side 188 (in the second direction D2) of the connection electrode 180 connected between the two opposite sides 149 define the opening 143 of the film which the common electrode 140 belongs to. The fourth via 155 of the second insulating layer 150 is communicated with the fifth via 135 of the first insulating layer 130. In the first direction D1, two opposite seventh sides 157 of the fourth via 155 of the second insulating layer 150 are aligned with the two opposite sides 149 of the common electrode 140. In addition, the two opposite sides 149 of the opening 143 of the common electrode 140 are aligned with the two opposite eighth sides 137 of the fifth via 135 of the first insulating layer 130.

Referring to FIG. 1, FIG. 5A, FIG. 5B and FIG. 6, in the present embodiment, the bridge electrode 190 is disposed on the second insulating layer 150 and electrically connected with the touch signal line 170 through the fourth via 155 of the second insulating layer 150, a part of the opening 143 of the common electrode 140 and the fifth via 135 of the first insulating layer 130. Being similar to the opening 142 described above, a width W8 of the opening 143 of the common electrode 140 in the first direction D1 is substantially equal to a width W7 of the fifth via 135 of the first insulating layer 130 in the first direction D1. In addition, the fourth via 155 and the fifth via 135 overlaps a part of the touch signal line 170.

In the present embodiment, a ninth side 158 of the fourth via 155 of the second insulating layer 150 in the second direction D2 and the tenth side 188 of the opening 143 of the film which the common electrode 140 belongs to are not aligned with each other in the direction perpendicular to the substrate. In other words, the ninth side 158 is apart from the tenth side 188 by a distance K2. In the present embodiment, the second insulating layer 150 covers the common electrode 140 in the first direction D1 and covers the connection electrode 180 in the second direction D2, and the fourth via 155 is communicated with the fifth via 135. The tenth side 188 of the connection electrode 180 is not adjacent to the fifth via 135 of the first insulating layer 130 and the fourth via 155 of the second insulating layer 150. To be specific, the second insulating layer 150 covers the tenth side 188 of the connection electrode 180, without covering the two opposite sides 149 of the adjacent common electrodes 140.

In the manufacturing process of the pixel array substrate 10 of the present embodiment described above, before the first insulating layer 130 and the second insulating layer 150 are patterned, the film which the common electrode 140 having the opening 143 belongs to is disposed on the first insulating layer 130, and thus, during the process of patterning the first insulating layer 130 and the second insulating layer 150, the film which the common electrode 140 belongs to protects the first insulating layer 130 thereunder, while the two opposite sides 149 of the opening 143 of the film which the common electrode 140 belongs to is self-aligned with the eighth sides 137 of the fifth via 135 of the first insulating layer 130. In this way, the sides 149 of the opening 143 of the film which the common electrode 140 belongs to are capable of being sufficiently adjacent to the eighth sides 137 of the fifth via 135 of the first insulating layer 130 (i.e., the sides 149 of the opening 143 of the film which the common electrode 140 belongs to are aligned with the eighth sides 137 of the fifth via 135 of the first insulating layer 130) to increase an area for disposing the film which the common electrode 140 belong to, so as to enhance the aperture ratio of the pixel array substrate 10.

Referring to FIG. 1, FIG. 5A, FIG. 5B and FIG. 6, in the present embodiment, the bridge electrode 190 is disposed on the second insulating layer 150 and electrically connected with the touch signal line 170 through the fourth via 155 of the second insulating layer 150 and the fifth via 135 of the first insulating layer 130. To be specific, connection portion 192 of the bridge electrode 190 extends into the fourth via 155 of the second insulating layer 150 and the fifth via 135 of the first insulating layer 130 from a part of the bridge electrode 190 overlapping the connection electrode 180. Specifically, the connection portion 192 may cross the ninth side 158 in the second direction D2 to enter an area of the fourth via 155 and the fifth via 135. A width We of the connection portion 192 in the first direction D1 is smaller than the width W7 of the fifth via 135 in the first direction D1 and is separated from the two opposite sides 149 of the common electrode 140 respectively by distances Wd and Wd'.

In the present embodiment, the width We of the connection portion 192 of the bridge electrode 190 in the first direction D1 is smaller than the width W7 of the fifth via 135 in the first direction D1. The connection portion 192 may be considered as a fine branch of the bridge electrode 190 filled into the fourth via 155 and the fifth via 135. The width We of the connection portion 192 in the first direction D1 is smaller than the width W7 of the fifth via 135 first direction D1 (i.e., the width W7 is a distance between the sides 149 of two adjacent common electrodes 140 in the first direction D0, and thus, even though the film which the bridge electrode 190 belong to and the film which the common electrode 140 belong to are not aligned to each other in high accuracy, the connection portion 192 of the thin bridge electrode 190 may be prevented from contacting the side wall 149a of the common electrode 140 defining the sides 149, thereby avoiding the short-circuit issue. In this way, the manufacturing yield of the pixel array substrate 10 may be enhanced. For instance, in the present embodiment, the width We of the connection portion 192 may be, for example, 2.5 μm to 4 μm, and the width W7 of the fifth via 135 may be, for example, 10 μm to 12 μm, but the invention is not limited thereto.

Accordingly, as described above, a plurality of common electrodes 140 of the same group may be electrically connected through the connection electrode 180 to form a touch sensing electrode 200, and one touch sensing electrode 200 is electrically connected with the touch signal line 170 by using the bridge electrode 190, such that the common electrode 140, in the touch control mode, may transmit/receive touch signals through the touch signal line 170, thereby determining a touched position of a user.

Figure 7:
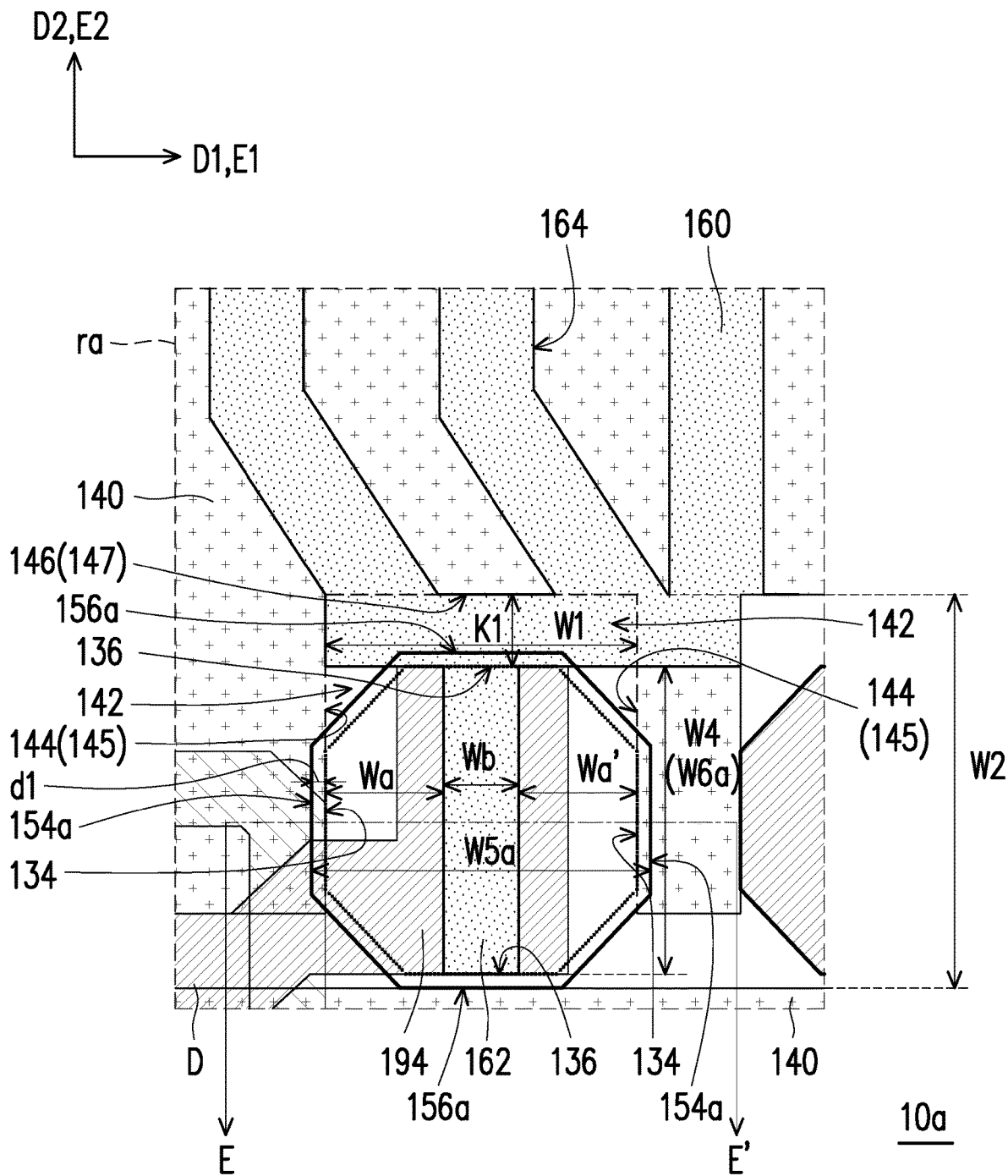
FIG. 7 is a schematic enlarged view of a part of a pixel array substrate according to another embodiment of the invention.
Figure 8:
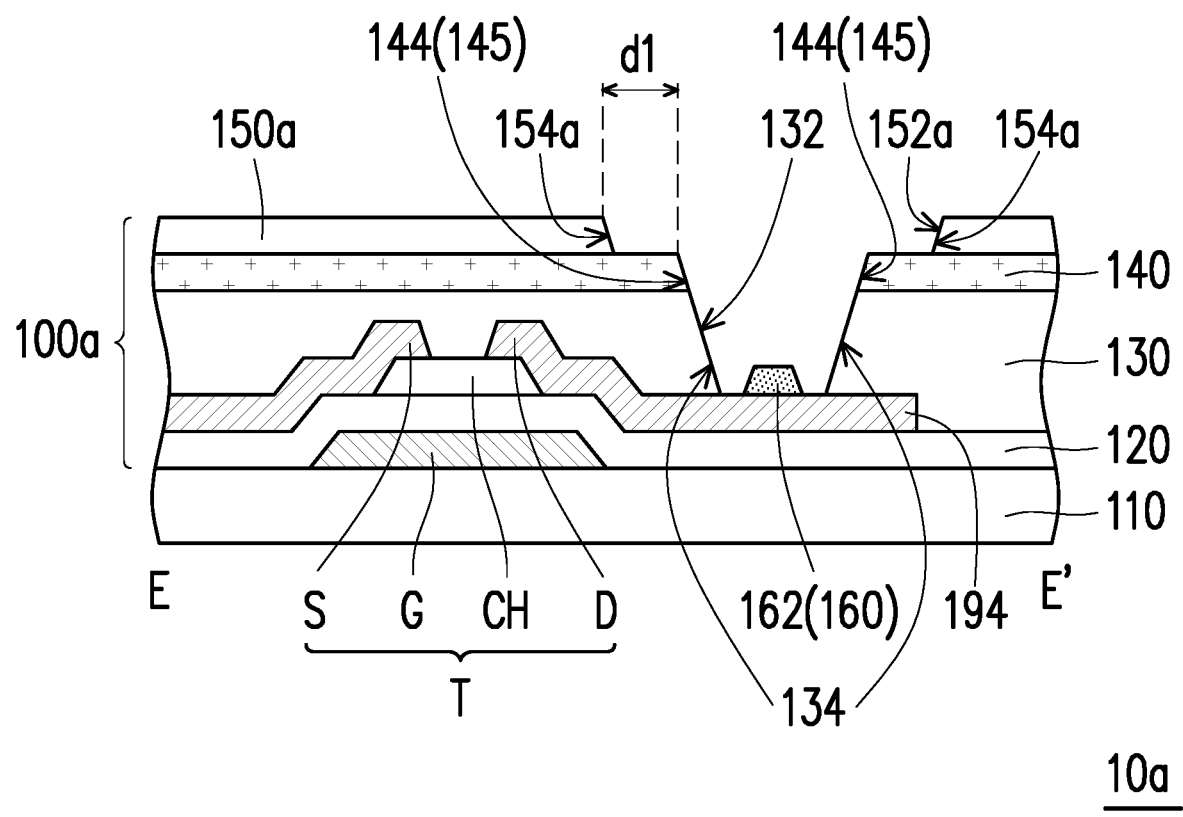
FIG. 8 is a schematic cross-sectional view corresponding to the section line E-E' depicted in FIG. 7.

FIG. 7 is a schematic partially enlarged view of a part ra of a pixel array substrate 10a according to another embodiment of the invention. FIG. 8 is a schematic cross-sectional view of a pixel array substrate 10a corresponding to the section line E-E' depicted in FIG. 7. The pixel array substrate 10a illustrated in FIG. 7 and FIG. 8 is similar to the pixel array substrate 10 illustrated in FIG. 3 and FIG. 2A, and thus, the same or similar elements are labeled by the same or similar reference numerals. Herein, only the difference between the pixel array substrate 10a and the pixel array substrate 10, and the other parts which are not described may correspondingly refer to the descriptions set forth above. Referring to FIG. 7 and FIG. 8, in the present embodiment, fifth sides 154a of a second via 152a of a second insulating layer 150a of each of the pixel units 100a are located on the physical portion of the common electrode 140, without being aligned with the first sides 134 of the first via 132. To be specific, before the first insulating layer 130 and the second insulating layer 150a are patterned, the common electrode 140 having the opening 142 is disposed on the first insulating layer 130, and thus, during the process of patterning the first insulating layer 130 and the second insulating layer 150a, the common electrode 140 protects the first insulating layer 130 thereunder. The common electrode 140 may be considered as a hard mask of the first insulating layer 130. After the first insulating layer 130 and the second insulating layer 150a are patterned with the same mask, as the first insulating layer 130 and the second insulating layer 150a are made of different materials and have different etch rates, the width of the first via 132 is smaller than a width of the second via 152a of the second insulating layer 150a because the first insulating layer 130 is covered by the common electrode 140, and a width W5a of the second via 152a of the etched second insulating layer 150a in the first direction D1 is greater than the width W1 of the opening 142 in the first direction D1. Thus, the width W5a of the second via 152a of the second insulating layer 150a located on the common electrode 140 in the first direction D1 is greater than the width W1 of the opening 142 in the first direction D1. The third sides 144 of the opening 142 are aligned with the first sides 134 of the first via 132, and the fifth sides 154a of the second via 152a are apart from the first sides 134 by a distance d1, the fifth sides 154a are not aligned with the first sides 134.

In light of the foregoing, the pixel array substrate of one of the embodiments of the invention includes the plurality of pixel units. Each of the pixel units includes the thin film transistor, the first insulating layer, the common electrode, the second insulating layer and the pixel electrode. The two opposite first sides of the first via of the first insulating layer are aligned with the two opposite third sides of the opening of the common electrode. The second via of the second insulating layer is communicated with the opening and the first via. The fourth side of the opening of the common electrode is not adjacent to the first via and the second via, and the pixel electrode is electrically connected with the thin film transistor through the second via, the opening and the first via.

The width of the connection portion of the pixel electrode in the first direction is set to be smaller than the width of the first via in the first direction, and thereby, the connection portion a fine branch of the pixel electrode which is filled into the first via and the second via. Thus, even though the film which the pixel electrode belongs to and the film which the common electrode belongs to are not aligned to each other in high accuracy, the connection portion of the thin pixel electrode can be prevented from contacting the side walls of the common electrode and from causing the short-circuit issue. In this way, the manufacturing yield of the pixel array substrate 10 may be enhanced. In addition, when the first insulating layer and the second insulating layer are patterned, the sides of the opening of the common electrode in the first direction can be self-aligned by employing the common electrode as the hard mask of the first insulating layer, such that the sides of the opening of the common electrode can sufficiently adjacent to the first sides of the first via of the first insulating layer to increase the area of the physical portion of the common electrode, thereby increasing the aperture ratio of the pixel array substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A pixel array substrate, comprising:
   a plurality of pixel units, wherein each of the pixel units comprises:
      a thin film transistor having a source and a gate;
      a first insulating layer, disposed on the thin film transistor and having a first via, wherein the first via has two first sides opposite to each other in a first direction and two second sides opposite to each other in a second direction;
      a common electrode, disposed on the first insulating layer and having an opening communicated with the first via, wherein the opening has two third sides opposite to each other in the first direction and at least one fourth side in the second direction, the third sides of the opening of the common electrode are aligned with the first sides of the first via of the first insulating layer, and a width of the opening of the common electrode in the first direction is substantially equal to a width of the first via of the first insulating layer in the first direction;
a second insulating layer, covering the common electrode, having a second via communicated with the opening and the first via, wherein the fourth side of the opening of the common electrode is not adjacent to the first via and the second via;
a pixel electrode, disposed on the second insulating layer and electrically connected with the thin film transistor through the second via of the second insulating layer, the opening of the common electrode and the first via of the first insulating layer; and
a scan line and a data line, electrically connected with the source and the gate of the thin film transistor, respectively, wherein the pixel electrode has a connection portion and a main portion, the connection portion is overlapped with the first via of the first insulating layer, the main portion is disposed outside the first via of the first insulating layer, the connection portion and the main portion are arranged in the second direction, and the first direction is perpendicular to the second direction,
wherein the data lines of the plurality of pixel units are arranged in the first direction, the scan lines of the plurality of pixel units are arranged in the second direction, and the first direction of the second direction are staggered with each other.

2. The pixel array substrate according to claim 1, wherein a width of the opening of the common electrode in the second direction is greater than a width of the first via of the first insulating layer in the second direction.

3. The pixel array substrate according to claim 1, wherein the common electrode has two opposite first side walls defining the third sides of the opening and at least one second side wall defining the at least one fourth side, the second insulating layer covers the at least one second side wall of the common electrode, without covering the first side walls of the common electrode.

4. The pixel array substrate according to claim 3, wherein the pixel electrode extends onto the second insulating layer covering the second side wall of the common electrode, without covering the first side walls of the common electrode.

5. The pixel array substrate according to claim 1, wherein the pixel electrode has the connection portion configured to connect with the thin film transistor, and at least a part of the connection portion is located in the first via of the first insulating layer and apart from the third sides of the opening of the common electrode by a distance.

6. The pixel array substrate according to claim 1, wherein the pixel electrode has the connection portion configured to connect with the thin film transistor, and a width of the connection portion in the first direction is smaller than a width of the opening of the common electrode in the first direction.

7. The pixel array substrate according to claim 1, wherein the second via of the second insulating layer has two fifth sides opposite to each other in the first direction and two sixth sides opposite to each other in the second direction, a width of the opening in the second direction is greater than a width of the second via of the second insulating layer in the second direction, and the second sides of the first via and the sixth sides of the second via are aligned with and adjacent to each other.

8. The pixel array substrate according to claim 7, wherein the fifth sides of the second via are aligned with the first sides of the first via.

9. The pixel array substrate according to claim 7, wherein the fifth sides of the second via are located on a physical portion of the common electrode, without being aligned with the first sides of the first via.

10. A pixel array substrate, comprising:
a plurality of pixel units, wherein each of the pixel units comprises:
a thin film transistor;
a first insulating layer, disposed on the thin film transistor;
a common electrode, disposed on the first insulating layer;
a second insulating layer, covering the common electrode;
a pixel electrode, disposed on the second insulating layer and electrically connected with the thin film transistor;
a scan line and a data line, electrically connected with the thin film transistor and staggered with each other, wherein the scan line extends along a first direction, the data line extends along a second direction;
the pixel array substrate further comprises:
a touch signal line, disposed between the data lines of two adjacent pixel units and extending along the second direction;
a connection electrode, located above the touch signal line and electrically connected between two of the common electrodes of two adjacent pixel units; and
a bridge electrode, electrically connected between the touch signal line and the connection electrode, wherein the bridge electrode is located between two of the pixel electrodes of two adjacent pixel units and separated from the pixel electrodes, the second insulating layer has a via, the bridge electrode is electrically connected with the connection electrode through the via, and a portion of the via is overlapped with the touch signal line.

11. The pixel array substrate according to claim 10, wherein the first insulating layer has a first via, the first via has two first sides opposite to each other in the first direction and two second sides opposite to each other in the second direction; the common electrode has an opening communicated with the first via, the opening has two third sides opposite to each other in the first direction and at least one fourth side in the second direction, and the third sides of the opening of the common electrode are aligned with the first sides of the first via of the first insulating layer; the second insulating layer has a second via communicated with the opening and the first via, the fourth side of the opening of the common electrode is not adjacent to the first via and the second via; the pixel electrode is electrically connected with the thin film transistor through the second via of the second insulating layer, the opening of the common electrode and the first via of the first insulating layer.

12. The pixel array substrate according to claim 11, wherein the thin film transistor has a source and a gate; the scan line and the data line are electrically connected with the source and the gate of the thin film transistor, respectively; the data lines of the plurality of pixel units are arranged in the first direction, the scan lines of the plurality of pixel units are arranged in the second direction, and the first direction of the second direction are staggered with each other; a width of the opening of the common electrode in the first direction is substantially equal to a width of the first via of the first insulating layer in the first direction.

13. The pixel array substrate according to claim 11, wherein a width of the opening of the common electrode in the second direction is greater than a width of the first via of the first insulating layer in the second direction.

14. The pixel array substrate according to claim 11, wherein the common electrode has two opposite first side walls defining the third sides of the opening and at least one second side wall defining the at least one fourth side, the second insulating layer covers the at least one second side wall of the common electrode, without covering the first side walls of the common electrode.

15. The pixel array substrate according to claim 11, wherein the pixel electrode has a connection portion configured to connect with the thin film transistor, and at least a part of the connection portion is located in the first via of the first insulating layer and apart from the third sides of the opening of the common electrode by a distance.

16. The pixel array substrate according to claim 11, wherein the pixel electrode has a connection portion configured to connect with the thin film transistor, and a width of the connection portion in the first direction is smaller than a width of the opening of the common electrode in the first direction.

17. The pixel array substrate according to claim 11, wherein the second via of the second insulating layer has two fifth sides opposite to each other in the first direction and two sixth sides opposite to each other in the second direction, a width of the opening in the second direction is greater than a width of the second via of the second insulating layer in the second direction, and the second sides of the first via and the sixth sides of the second via are aligned with and adjacent to each other.

18. The pixel array substrate according to claim 11, wherein the bridge electrode and the pixel electrode belong to the same film.

19. The pixel array substrate according to claim 11, wherein the second insulating layer further has a fourth via, the first insulating layer further has a fifth via communicated with the fourth via, and the bridge electrode is electrically connected with the touch signal line through the fourth via and the fifth via.

20. The pixel array substrate according to claim 19, wherein the bridge electrode has a connection portion extending into the fourth via and the fifth via, and a width of the connection portion of the bridge electrode in the first direction is smaller than a width of the fifth via in the first direction.

* * * * *